US011150709B2

(12) United States Patent
Imwalle et al.

(10) Patent No.: US 11,150,709 B2
(45) Date of Patent: *Oct. 19, 2021

(54) DYNAMIC SERVER-LEVEL THERMAL CONTROL BASED ON COMPONENT TEMPERATURES

(71) Applicant: Google LLC, Mountain View, CA (US)

(72) Inventors: Gregory Imwalle, Mountain View, CA (US); David W. Stiver, Santa Clara, CA (US); Andrew J. Schran, San Francisco, CA (US); Thomas Chris Newcomb, Soquel, CA (US)

(73) Assignee: Google LLC, Mountain View, CA (US)

( * ) Notice: Subject to any disclaimer, the term of this patent is extended or adjusted under 35 U.S.C. 154(b) by 261 days.

This patent is subject to a terminal disclaimer.

(21) Appl. No.: 16/531,441

(22) Filed: Aug. 5, 2019

(65) Prior Publication Data

US 2019/0354151 A1 Nov. 21, 2019

Related U.S. Application Data

(60) Division of application No. 15/969,942, filed on May 3, 2018, now Pat. No. 10,429,910, which is a continuation of application No. 14/267,393, filed on May 1, 2014, now Pat. No. 10,007,309, which is a
(Continued)

(51) Int. Cl.
*G06F 1/20* (2006.01)
*H05K 7/20* (2006.01)

(52) U.S. Cl.
CPC ......... *G06F 1/206* (2013.01); *H05K 7/20836* (2013.01)

(58) Field of Classification Search
None
See application file for complete search history.

(56) References Cited

U.S. PATENT DOCUMENTS

| 5,416,728 A | 5/1995 | Rudzewicz et al. |
| 5,528,908 A | 6/1996 | Bahel et al. |
| 5,825,100 A | 10/1998 | Kim |

(Continued)

OTHER PUBLICATIONS

Chan, Temperature-Dependent Standard Deviation of Log (Failure Time) Distributions, IEEE Transactions on Reliability, vol. 40, pp. 157-160, 1991.

(Continued)

*Primary Examiner* — Bernard G Lindsay
(74) *Attorney, Agent, or Firm* — Lerner, David, Littenberg, Krumholz & Mentlik, LLP

(57) ABSTRACT

An apparatus for monitoring and maintaining thermal exhaust temperatures for monitored servers may include a processor in communication with an exhaust temperature control system. The processor may implement various control loops to monitor inlet and exhaust temperatures for one or more servers, and the processor may monitor temperatures of various hardware components within those one or more servers. When the processor determines that a hardware component for a given server is overheating, the processor may take steps to decrease the temperature of the overheating hardware component for the given server. To determine whether a hardware component is overheating, the processor may leverage the hardware component's operating temperature margin.

14 Claims, 4 Drawing Sheets

Related U.S. Application Data continuation-in-part of application No. 13/744,902, filed on Jan. 18, 2013, now abandoned.

(60) Provisional application No. 61/589,003, filed on Jan. 20, 2012.

(56) References Cited

U.S. PATENT DOCUMENTS

| | | | |
|---|---|---|---|
| 5,955,867 A | 9/1999 | Cummings et al. | |
| 6,216,235 B1 | 4/2001 | Thomas et al. | |
| 10,007,309 B1 | 6/2018 | Imwalle et al. | |
| 2004/0001320 A1 | 1/2004 | Baar et al. | |
| 2004/0264124 A1 | 12/2004 | Patel et al. | |
| 2006/0032250 A1 | 2/2006 | Flanigan et al. | |
| 2008/0300818 A1 | 12/2008 | Brey et al. | |
| 2009/0201644 A1* | 8/2009 | Kelley | H05K 7/2079 361/699 |
| 2009/0207564 A1* | 8/2009 | Campbell | H05K 7/20836 361/688 |
| 2009/0268404 A1* | 10/2009 | Chu | H05K 7/20836 361/696 |
| 2010/0110632 A1 | 5/2010 | Rose et al. | |
| 2010/0262299 A1 | 10/2010 | Cheung et al. | |
| 2011/0314853 A1* | 12/2011 | Ito | H05K 7/20836 62/186 |
| 2012/0218707 A1* | 8/2012 | Chan | H05K 7/20836 361/679.48 |
| 2013/0083481 A1* | 4/2013 | Goto | H05K 7/20836 361/695 |
| 2013/0139000 A1 | 5/2013 | Nakamura et al. | |

OTHER PUBLICATIONS

Hafizi, et al., IEEE Transactions on Electron Devices, vol. 40, pp. 1583-1588, 1993.

Kalogirou, Solar Energy Engineering, Elsevier, 2009, p. 727.

* cited by examiner

DYNAMIC SERVER-LEVEL THERMAL CONTROL BASED ON COMPONENT TEMPERATURES

CROSS-REFERENCE TO RELATED APPLICATIONS

The present application is a divisional of U.S. patent application Ser. No. 15/969,942, filed on May 3, 2018, which is a continuation of U.S. patent application Ser. No. 14/267,393, filed on May 1, 2014, and issued as U.S. Pat. No. 10,007,309 on Jun. 26, 2018, which is a continuation-in-part of U.S. patent application Ser. No. 13/744,902, filed on Jan. 18, 2013, which claims the benefit of the filing date of U.S. Provisional Patent Application No. 61/589,003 filed on Jan. 20, 2012, the disclosures of which are hereby incorporated herein by reference.

BACKGROUND

The use of multiple servers in computing environments has increased over the last several years. Typically, these multiple servers may work in conjunction as a "server farm" or "server cluster." These server clusters often have needs on a scale that would not ordinarily concern a user with a single computer. One such need is the management of heat generated by the server cluster and maintaining an acceptable operating temperature for any given server within the server cluster.

In managing the heat generated by the server cluster, any number of temperatures may be monitored. One temperature that is usually monitored is the thermal exhaust temperature of a given server or the exhaust temperatures of multiple servers. Generally, the thermal exhaust temperature is the temperature of the air that exits from a server's exhaust. The thermal exhaust temperature may provide an indication of how hot the server is operating at any given time.

At certain times, the thermal exhaust temperature of a given server or a group of servers may exceed an acceptable operating temperature. When this occurs, many problems can happen. One problem is that the internal hardware of the given server or group of servers, such as processors, hard drives, memories, or other types of hardware, may start to fail. The hardware may fail because the hardware may be rated not to exceed a given temperature during operations.

Another problem that may occur is "throttling." Throttling is a phenomenon whereby an over-heating server reduces hardware operations to reduce heat. The reduction in hardware operations typically means that the throttling server has reduced performance when compared with other non-throttling servers. Moreover, when the number of servers that are throttling reaches a critical level, the entire server cluster may have reduced performance.

Furthermore, the throttling of one or more servers may indicate a more serious failure is imminent. Throttling may be only the first stage in a typical scenario. Throttling may be followed by server failures where errors are introduced that may be correctable, progressing into server failures where errors are introduced that may not be correctable. Finally, server faults and, ultimately, server shutdown, may be the final stages in the failure progression. Thus, throttling may be but a indication that more or severe failures are expected or imminent.

Although monitoring the thermal exhaust temperature of the servers in the server cluster is a typical solution to the overheating and throttling problem, there are complexities associated with monitoring the thermal exhaust temperature. Such complexities include that the individual servers of server cluster may have different configurations, server clusters may be operating in different environments, the power requirements for server clusters may vary, and the inlet temperature (the temperature of the air that a server intakes) may vary from server to server or from server cluster to server cluster.

SUMMARY

To address these and other problems, this disclosure provides for an apparatus for maintaining thermal exhaust temperatures. In one implementation, the apparatus includes an exhaust temperature control system and a processor in communication with the exhaust temperature control system. The processor may be configured to implement a first temperature control monitoring loop. The first temperature control monitoring loop may include monitoring a first temperature value, determining a temperature difference value from the first temperature value, determining a second temperature value from the first temperature value and the temperature difference value, and transmitting the determined second temperature value to the exhaust temperature control system.

The processor may also be configured to implement a second temperature control monitoring loop. The second temperature control monitoring loop may include monitoring a plurality of component temperature margin values and establishing the temperature difference value as a minimum temperature difference value based on comparing a selected one of the component temperature margin values with a first component margin threshold value.

In another implementation of the apparatus, the first temperature value comprises an inlet temperature value derived from an inlet temperature source.

In a further implementation of the apparatus, determining the temperature difference value comprises querying a temperature difference database with the first temperature value.

In yet another implementation of the apparatus, a selected one of the plurality of component temperature margin values represents a difference between a component temperature value for a hardware component and a component temperature threshold value for the hardware component.

In yet a further implementation of the apparatus, the second temperature control monitoring loop further comprises increasing the temperature difference value by a predetermined amount based on a comparison of a selected one of the component temperature margin values with the first component margin threshold value and a comparison of an average value of the plurality of component temperature margin values with a second component margin threshold value.

This disclosure also provides a method for maintaining thermal exhaust temperatures. In one implementation, the method includes monitoring, with a processor in communication with an exhaust temperature control system, a first temperature value and monitoring a plurality of component temperature margin values. The method may also include determining a temperature difference value from the first temperature value and establishing the temperature difference value as a minimum temperature difference value based on comparing a selected one of the component temperature margin values with a first component margin threshold value. The method may further include determining a second temperature value from the first temperature value and the temperature difference value, and transmitting the determined second temperature value to the exhaust temperature control system.

In another implementation of the method, the first temperature value comprises an inlet temperature value derived from an inlet temperature source.

In a further implementation of the method, determining the temperature difference value comprises querying a temperature difference database with the first temperature value to obtain the temperature difference value.

In yet another implementation of the method, a selected one of the plurality of component temperature margin values represents a difference between a component temperature value for a hardware component and a component temperature threshold value for the hardware component.

In yet a further implementation of the method, the method further comprises increasing the temperature difference value by a predetermined amount based on a comparison of a selected one of the component temperature margin values with the first component margin threshold value, and a comparison of an average value of the plurality of component temperature margin values with a second component margin threshold value.

This disclosure also provides another apparatus for maintaining a thermal exhaust temperature. In one implementation, the apparatus includes a memory that stores a temperature difference database and a processor in communication with the memory. The processor may be configured to receive an inlet temperature value from an inlet temperature source, determine a temperature difference value from the temperature difference database based on the received inlet temperature value, determine an expected exhaust temperature value based on the determined temperature difference value and the received inlet temperature value, measure an exhaust temperature value, and adjust the operation of at least one cooling device based on a comparison of the measured exhaust temperature value and the expected exhaust temperature value.

In another implementation of the apparatus, the inlet temperature source is a temperature probe that monitors an air inlet.

In a further implementation of the apparatus, the inlet temperature source is an inlet temperature database, and the inlet temperature value is selected based on a geographic location.

In yet another implementation of the apparatus, the processor is further configured to determine the temperature difference value through interpolation when the temperature difference database does not include the received inlet temperature value.

In yet a further implementation of the apparatus, the processor is further configured to adjust the determined temperature difference value based on a comparison of a component margin value for a hardware component and a component margin threshold value for the hardware component.

This disclosure also provides another method for maintaining a thermal exhaust temperature. In one implementation, the method includes storing, in a memory, a temperature difference database, receiving, with a processor in communication with the memory, an inlet temperature value from an inlet temperature source, and determining a temperature difference value from the temperature difference database based on the received inlet temperature value. The method may also include determining an expected exhaust temperature value based on the determined temperature difference value and the received inlet temperature value, measuring an exhaust temperature value, and adjusting the operation of at least one cooling device based on a comparison of the measured exhaust temperature value and the expected exhaust temperature value.

In another implementation of the method, the inlet temperature source is a temperature probe that monitors an air inlet.

In a further implementation of the method, the inlet temperature source is an inlet temperature database, and the inlet temperature value is selected based on a geographic location.

In yet another implementation of the method, the method includes determining the temperature difference value through interpolation when the temperature difference database does not include the received inlet temperature value.

In yet a further implementation of the method, the method includes adjusting the determined temperature difference value based on a comparison of a component margin value for a hardware component and a component margin threshold value for the hardware component.

DETAILED DESCRIPTION

The present disclosure relates to a thermal exhaust monitoring system, and in particular, to a thermal exhaust monitoring system that may modulate cooling fans on a server such that the exhaust temperature of the server is maintained at a predetermined temperature value. In one implementation, the predetermined temperature value may be 45° C., but the predetermined temperature value may be established as any temperature value. In addition, the thermal exhaust monitoring system may dynamically determine if a given server should have one or more temperature setpoints adjusted to maintain the health of a given hardware component. In general, the thermal exhaust monitoring system may protect a given percentage of servers in a server cluster from throttling, without having to adjust all the servers in the server cluster, or running a particular platform.

Figure 1:
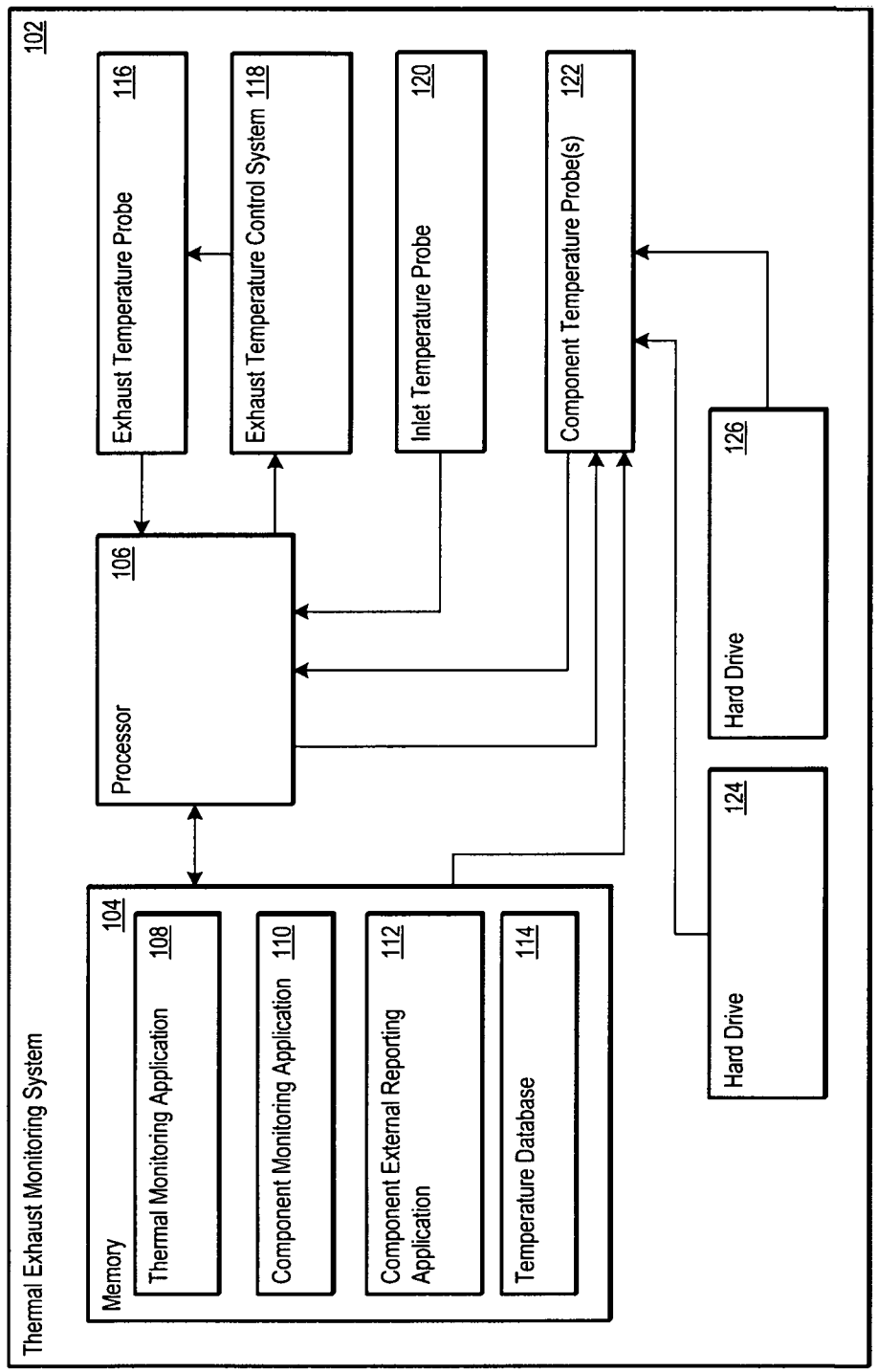
FIG. 1 illustrates one example of a thermal exhaust monitoring system according to aspects of the disclosure.

FIG. 1 illustrates one example of a thermal exhaust monitoring system 102. The thermal exhaust monitoring system 102 may include several components for monitoring a thermal exhaust exiting from one or more servers. In one implementation, the thermal exhaust monitoring system 102 may include a memory 104 in communication with a processor 106. The memory 104 may contain information and applications accessible by processor 106, including one or more applications 108-112 that may be executed or otherwise used by the processor 106. The memory 104 may also include a database 114 accessible by the processor 106.

The memory 104 may be of any type of memory configured to store information accessible by the processor 106, including a computer-readable medium, or other medium that stores data that may be read with the aid of an electronic device, such as a hard-drive, memory card, ROM, RAM, DVD or other optical disks, as well as other write-capable and read-only memories. Systems and methods may include different combinations of the foregoing, whereby different portions of the applications 108-112 and database 114 are stored on different types of media.

The applications 108-112 may include any set of computer-executable instructions to be executed directly (such as machine code) or indirectly (such as scripts) by the processor 106. For example, the computer-executable instructions may be stored as computer code on a computer-readable medium. In that regard, the terms "instructions," "programs," and "applications" may be used interchangeably herein. The instructions may be stored in object code format for direct processing by the processor 106, or in any other computer language including scripts or collections of independent source code modules that are interpreted on demand or compiled in advance. Functions, methods and routines of these instructions are explained in more detail below.

The database 114 may be retrieved, stored or modified by processor 106 in accordance with the applications 108-112. For instance, although systems and methods disclosed herein are not limited by any particular data structure, the database 114 may be stored in computer registers, as a relational database defined by a table having a plurality of different fields and records, Extensible Markup Language ("XML") documents or flat files. The database 114 may also be formatted in any computer-readable format. By further way of example only, image data may be stored as bitmaps comprised of grids of pixels that are stored in accordance with formats that are compressed or uncompressed, lossless (e.g., BMP) or lossy (e.g., JPEG), and bitmap or vector-based (e.g., SVG), as well as computer instructions for drawing graphics. The database 114 may comprise any information sufficient to identify the relevant information, such as numbers, descriptive text, proprietary codes, references to data stored in other areas of the same memory or different memories (including other network locations) or information that is used by a function to calculate the relevant data.

The processor 106 may be any conventional processor or microprocessor, such as processors from Intel Corporation or Advanced Micro Devices. Alternatively, the processor may be a dedicated device such as an application-specific integrated circuit ("ASIC"). Although FIG. 1 functionally illustrates the processor 104, memory 106, and other elements of the thermal exhaust monitoring system 102 as being within the same block, it will be understood by those of ordinary skill in the art that the processor 104 and memory 106 may actually comprise multiple processors and memories that may or may not be stored within the same physical housing. For example, the memory 104 may be a hard drive or other storage media located in a housing different from that of the thermal exhaust monitoring system 102. Accordingly, references to a processor, server, the thermal exhaust monitoring system, or computer will be understood to include references to a collection of processors or computers or memories that may or may not operate in parallel. Rather than using a single processor to perform the steps described herein, some of the components, such as the exhaust temperature control system 118, may each have their own processor that perform operations related to the component's specific function.

In various of the aspects described herein, the processor 106 may be located remote from the thermal monitoring exhaust system 102 and may communicate with one or more components, such as the memory 104, wirelessly over a network. In addition, one or more of the components may be housed within other servers or computers, and the thermal exhaust monitoring system 102 may receive information from those components. For example, multiple servers may each have an exhaust temperature probe 116 and the processor may receive an exhaust temperature value from each of these exhaust temperature probes. In other aspects, some of the processes described herein are executed on a processor disposed within the thermal exhaust monitoring system 102 and others by a remote processor housed within a server being monitored, including performing the operations necessary to maintain a predetermined thermal exhaust temperature for the server being monitored.

The thermal exhaust monitoring system 102 may include all of the components normally used in connection with a computer such as a central processing unit (CPU), memory (e.g., RAM and internal hard drives) storing data and instructions to monitor temperatures and maintain a thermal exhaust temperature, user input devices (e.g., a mouse, keyboard, touch screen and/or microphone), as well as various sensors (e.g., inlet and exhaust temperature probes) for gathering temperature information about a monitored server or component.

The thermal exhaust monitoring system 102 may monitor and adjust the thermal exhaust temperature for a given server based on inlet temperature measurements. The inlet temperature measurements may be derived from a number of sources. In one implementation, the thermal exhaust monitoring system 102 may derive the inlet temperature from one or more inlet temperature probes 120. The one or more inlet temperature probes 120 may measure the air temperature for air entering a given server or computer. In addition, the measured inlet temperature may be averaged to smooth the measurements of the inlet temperature probe. In some instances, the environment of the inlet temperature probe may cause variations in the measured inlet temperature, and the averaging of the measured inlet temperature may provide for a more stable operating condition. For example, without averaging or smoothing, the variations in the measured inlet temperature may cause the thermal exhaust monitoring system 102 to unnecessarily change, or request adjustments in, a monitored exhaust temperature.

Where the inlet temperature probe 120 is mounted locally to the thermal exhaust monitoring system 102, the inlet temperature probe 120 may communicate the measured air temperature via the processor 106. Alternatively, where the inlet temperature probe 120 is mounted on a given server or computer, the inlet temperature probe 120 may communicate the measured air temperature via a network to the thermal exhaust monitoring system 102, such as a wired network, a wireless network, or a combination of wired and wireless networks. Examples of wired networks include Ethernet, the Internet, token ring networks, or other such wired networks. Examples of wireless networks include 802.11 b/g/n, Bluetooth, Wi-Max, and other such wireless networks.

In another implementation, the thermal exhaust monitoring system 102 may derive the inlet temperature from a temperature database 114 stored in the memory 104. The temperature database 114 may store an association of a given server's location and the expected inlet temperature. The expected inlet temperature of the temperature database 114 may be populated in a number of different ways, such as by a thermal engineer, a temperature probe in or near the location of the given server, or any other manner. Since a server may be located in a variety of environments, such as warm environments, cold environments, mild environments, and so forth, the temperature database 114 provides a mechanism by which the thermal exhaust monitoring system 102 may derive an inlet temperature for a given server. The temperature database 114 may also be useful in instances where an inlet temperature probe is not available for a given server.

In yet a further implementation, the thermal exhaust monitoring system 102 may be monitoring a given server where the database 114 may not contain an entry for the given server and the given server may not comprise an inlet temperature probe 120. Under these circumstances, the thermal exhaust monitoring system 102 may query the given server to determine whether the given server includes a specific component, where the specific component may be correlated to the temperature of a given environment. One example of such a component may be a battery connected to the server, where the presence of the battery may indicate the expected temperature of the environment in which the server resides.

Where the given server includes the specific component (e.g., a battery), the thermal exhaust monitoring system 102 may assume that the given server is in a particular type of environment (e.g., a warm environment, hence the need for a battery to power an exhaust temperature control system) and may establish that the inlet temperature of the given server is a first predetermined temperature (e.g., 27° C.). Where the given server replies that it does not include the component (e.g., the battery), the thermal exhaust monitoring system 102 may assume that the given server is in a second, perhaps different, type of environment (e.g., a cold environment, hence the lack of a battery to power the exhaust temperature control system). In this circumstance, the thermal monitory system 102 may establish that the inlet temperature of the given server is a second predetermined temperature, such as 21° C. Of course, the thermal exhaust monitoring system 102 may query a given server to determine whether the given server has the specific component (e.g., the battery to power the exhaust temperature control system) even in instances where the given server has an inlet temperature probe 120, such as when the inlet temperature probe 120 has failed.

The thermal exhaust monitoring system 102 may determine an expected thermal exhaust for a given server via the thermal monitoring application 108 stored in the memory 104. The thermal monitoring application 108 may poll one or more sources of inlet temperatures for one or more servers at predetermined time intervals to determine whether an adjustment in a thermal exhaust temperature is needed. For example, the thermal monitoring application 108 may poll one or more sources of inlet temperatures at five-minute intervals. Other time intervals may include seconds, hours, days, and so forth.

Using the received inlet temperature, the thermal exhaust monitoring system 102 may determine an expected thermal exhaust temperature via the thermal monitoring application 108. In one implementation, the thermal exhaust temperature may be determined as a function of a temperature difference, referenced as "temperature delta", and the measured (or derived) inlet temperature value. As one example, the thermal exhaust temperature may be determined from an operation, such as adding, the temperature delta and the inlet temperature value.

One of the advantages of the thermal exhaust monitoring system 102 is that it leverages temperature margins of servers and hardware components to maintain expected thermal exhaust temperatures. Examples of hardware components include hard drives, processors, dual in-line memory modules (DIMMs), single in-line memory modules (SIMMs), and other such hardware components. Each of these hardware components may have threshold operating temperatures, above which, the hardware components may perform inefficiently or experience a reduction in reliability or component life expectancy. Generally, a temperature margin for a hardware component is the difference between a current temperature of the hardware component and its threshold operating temperature. Temperature margins are important because a given server may have an exhaust temperature that is significantly lower than the threshold operating temperatures of its various components. In other words, a given server may be operating at a cooler temperature than necessary. Thus, by allowing the temperature margins of the server and/or components to decrease (i.e., operate at a higher temperature), the facility in which the server is located may gain additional cooling capacity for other servers that need it or an increase in operational efficiency.

The temperature delta, explained above, may represent the amount of temperature margin for a given inlet temperature. The temperature delta may be determined on a component-by-component basis or a server-by-server basis. For each inlet temperature, a corresponding temperature delta may be stored in the temperature database 114. In some instances, the corresponding temperature delta may not be available for a given inlet temperature. In these instances, the thermal monitoring application 108 may determine the temperature delta for the given inlet temperature through a variety of ways. For example, the thermal monitoring application 108 may use linear interpolation to determine a temperature delta when the given inlet temperature is between two inlet temperatures present in the temperature database 114. As another example, the thermal monitoring application 108 may determine the temperature delta as the nearest or closest temperature delta available in the temperature database 114 when the given inlet temperature falls outside of the range of inlet temperatures available in the temperature database 114. In this second example, should the temperature delta be 7° C., but the only available temperature deltas are 6° C., 9° C., and 13° C., the thermal monitoring application 108 may select the 6° C. temperature delta from the temperature database 114.

In determining thermal exhaust temperatures, the thermal monitoring application 108 may employ a number of safeguards to prevent failures or unexpected behaviors, such as overheating, or to prevent a given server from unnecessarily depriving a facility of its cooling capacity. To prevent overheating, the thermal monitoring application 108 may establish an absolute maximum exhaust temperature parameter. Alternatively, the absolute maximum exhaust temperature may be defined in the temperature database 114. The absolute maximum exhaust temperature parameter may define the maximum exhaust temperature at which a server operates.

To prevent a server from unnecessarily depriving a facility of its cooling capacity, the thermal monitoring application 108 may establish an absolute minimum exhaust temperature parameter. Alternatively, the absolute minimum exhaust temperature may be defined in the temperature database 114. The absolute minimum exhaust temperature parameter may define the minimum exhaust temperature at which a server may operate.

The thermal exhaust monitoring system 102 may also monitor the operating temperatures for one more hardware components via one or more component temperature probes 122. With reference to FIG. 1, examples of hardware components may include the memory 104, the processor 106, the hard drive 124, and the hard drive 126. Other types and combinations of hardware components are also possible.

Each of these hardware components may be monitored by a corresponding component temperature probe 122, and the component temperature probe 122 may report a component temperature to the thermal exhaust monitoring system 102 via a component monitoring application 110.

The component monitoring application 110 may be operating at the same time as the thermal monitoring application 108. It is also possible that the thermal monitoring application 108 and the component monitoring application 110 are the same application. The component monitoring application 110 may also provide for an interface for the thermal monitoring application 108 to communicate with the component monitoring application 110.

In one implementation, the component temperature probes 122 may report absolute component temperatures to the component monitoring application 110. That is, the component temperature probe may report that a given hardware component is operating at a specific temperature, such as 50° C. The component monitoring application 110 may then convert the reported absolute temperature into a component-specific margin temperature value. For example, a component temperature probe may report that a hard drive is operating at 50° C., and the component monitoring application 110 may then convert the 50° C. value into a component temperature margin value based on a previously stored component temperature threshold. The component temperature margin value may then be available to the thermal monitoring application 108. Alternatively, the thermal monitoring application 108 may receive the absolute temperature from the component monitoring application 110, and the thermal monitoring application 108 may either leverage the absolute temperature, convert the absolute temperature into a component temperature margin value, or a combination thereof.

In monitoring the various hardware components for a given server, the thermal exhaust monitoring system 102 may establish one or more component temperature parameters. One component temperature parameter may be a minimum component temperature margin value. The minimum component temperature margin value may represent an absolute minimum acceptable temperature margin for a given hardware component. In other words, the minimum component temperature margin value may represent the minimum difference between a hardware component's current operating temperature and the hardware component's threshold operating temperature. The minimum component temperature margin value may vary from component to component, and may also vary from server to server. Thus, the same types of hardware components may have different minimum component temperature margin values depending on the server where a hardware component resides.

Another component temperature parameter may be a maximum component temperature margin value. The maximum component temperature margin value may represent a maximum, time-averaged acceptable temperature margin for a given hardware component. As discussed below, the thermal exhaust monitoring system 102 may use this parameter in deciding whether to increase the temperature delta or increase the thermal exhaust temperature for a given server (e.g., increase the operating temperature of a given server). This decision may be based on whether an average worst component temperature margin value exceeds the maximum component temperature margin value.

The thermal exhaust monitoring system 102 may monitor the temperature margins of hardware components to prevent a given server from overheating or using too much of a server facility's cooling capacity. To prevent the overheating of a hardware component, the thermal exhaust monitoring system 102 may determine whether a component temperature margin has fallen below a corresponding minimum component temperature margin. Should a component temperature margin fall below a corresponding minimum component temperature margin, the thermal exhaust monitoring system 102 may set the temperature delta for the server to a minimum temperature delta. By setting the temperature delta for the server to a minimum temperature delta, the thermal exhaust monitoring system 102 ensures that the exhaust temperature flowing out of the given server is as low as may be handled by the server facility and cooler than the nominal operating exhaust temperature.

After the initial detection that a hardware component is potentially overheating, the thermal exhaust monitoring system 102 monitors the various component temperature margins for the hardware components. After a predetermined time period, such as five or ten minutes, the thermal exhaust monitoring system 102 may then determine whether the average component temperature margin, which may be an average of the component temperature margins for the hardware components residing in the given server, exceeds a component temperature margin threshold.

The component temperature margin threshold may be determined in any number of ways. For example, the component temperature margin threshold may be established by the manufacturer. As another example, the component temperature margin threshold may be established experimentally, such as by operating one or more components at various increasing temperatures and then determining the temperature at which one or more of the components exhibits a decrease in performance or an instability in performance.

Should the average component temperature margin exceed the component temperature margin threshold, the thermal exhaust monitoring system 102 may increment the temperature delta for the given server by a determined amount, such as 1° C. Increasing the temperature delta in this manner thus slowly increases the operating temperature of the given server so as to prevent unexpected hardware component failures. Increasing the temperature delta for the given server may continue until the thermal exhaust temperature for the given server has reached a nominal thermal exhaust temperature, which may be specified in the temperature database 114.

To adjust the operating temperatures of the servers being monitored by the thermal exhaust monitoring system 102, or even the operating temperature of the thermal exhaust monitoring system 102 itself, the thermal exhaust monitoring system 102 may communicate with an exhaust temperature control system 118. In one implementation, the exhaust temperature control system 118 may be located locally with the thermal exhaust monitoring system 102. In another implementation, each server being monitored by the thermal exhaust monitoring system 102 may include an exhaust temperature control system 118. The thermal exhaust temperature control system 118 may also be located remotely from the thermal exhaust monitoring system 102 and a server being monitored by the thermal exhaust monitoring system 102.

The thermal exhaust temperature control system 118 may include one or more cooling devices. An example of a cooling device is a fan. Another example of a cooling device is a radiator, such as the type used in liquid cooling solutions. Other cooling devices or combinations of cooling devices may also be used.

In one implementation, a cooling device may cool one or more of the hardware components present in a given server. In another implementation, each of the hardware components may have their own cooling device. The exhaust temperature control system 118 may also include an interface for communicating with the processor 106 of the thermal exhaust monitoring system 102.

When the thermal exhaust monitoring system 102 determines that either an exhaust temperature or a temperature delta of a given server is to be adjusted, the thermal exhaust monitoring system 102 may send a command to the exhaust temperature control system 118. In one implementation, the command may be to increase the cooling operations of the cooling device, such as increasing a fan speed for a fan, and the thermal exhaust monitoring system 102 may monitor the exhaust temperature probe 116 for changes in the thermal exhaust temperature as a result of the increased cooling operations. Alternatively, the thermal exhaust monitoring system 102 may send a specified temperature delta or thermal exhaust temperature to the exhaust temperature control system 118 and, in turn, the exhaust temperature control system 118 may make corresponding changes (e.g., increases or decreases) in the operations of the cooling device(s). In this alternative implementation, the exhaust temperature control system 118 may monitor the exhaust temperature of the given server until the exhaust temperature (or temperature delta) of the given server matches or is approximate to the thermal exhaust temperature (or temperature delta) specified by the thermal exhaust monitoring system 102.

The thermal exhaust monitoring system 102 may also provide interfaces for reporting various metrics and parameters to external entities, such as other servers or client devices, regarding the servers being monitored by the thermal exhaust monitoring system 102. Accordingly, the thermal exhaust monitoring system 102 may include a component external reporting application 112. The component external reporting application 112 may operate substantially simultaneously as the thermal monitoring application 108 and the component monitoring application 110. Of course, it is also possible that the component external reporting application 112 is the same application as the thermal monitoring application 108 and/or the component monitoring application 110.

The component external reporting application 112 may report one or more metrics and/or parameters to a client device (a server may also be a client device) based on a request from the client device. Examples of the reported metrics and/or parameters may include current temperature deltas for one or more servers, inlet temperatures, exhaust temperatures, component temperatures, component temperature margin or any other metric or parameter discussed herein. The component external reporting application 112 may communicate these metrics and/or parameters over a network, such as a wired network, a wireless network, or a combination of wired and wireless networks.

Figure 2:
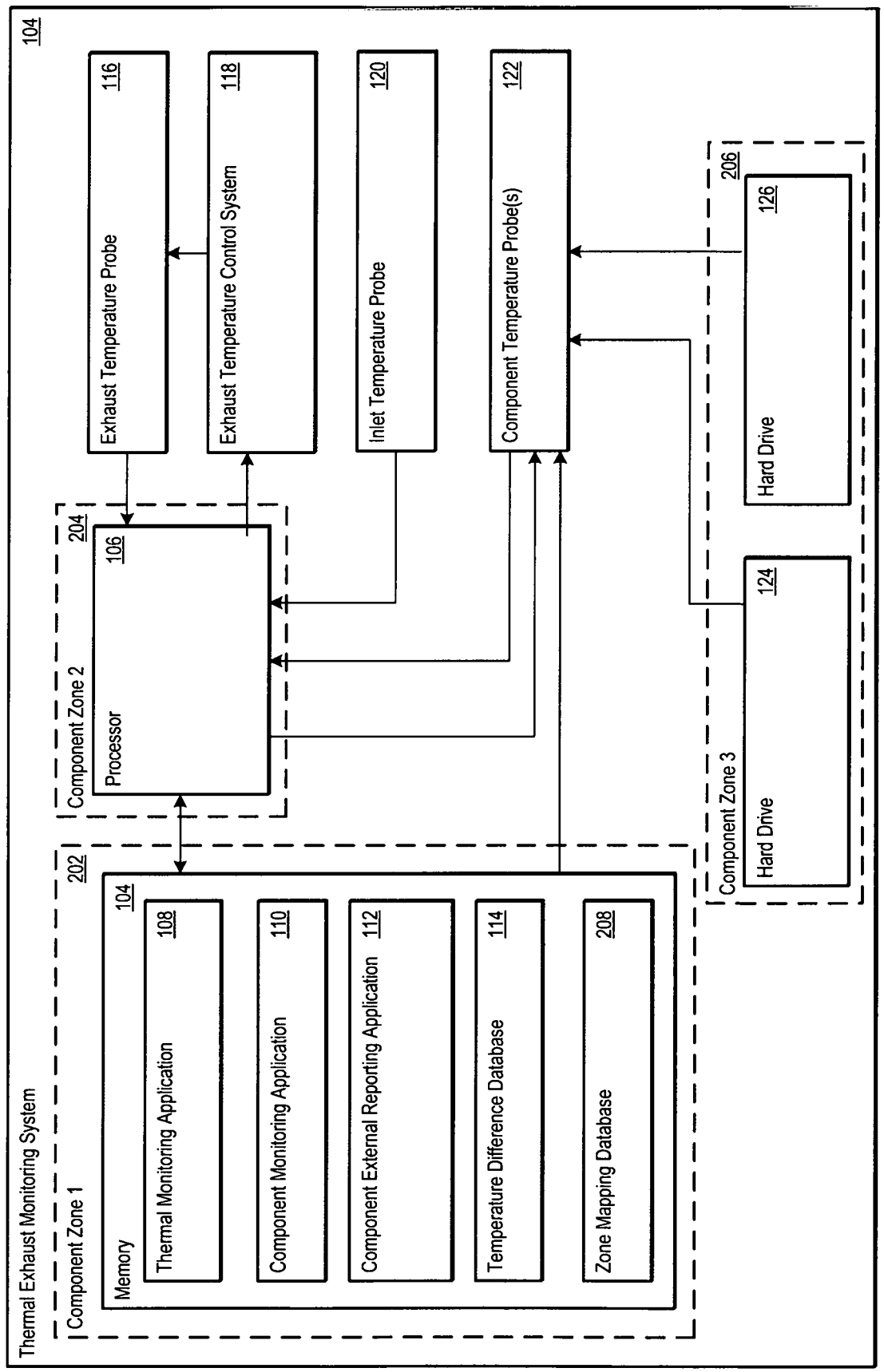
FIG. 2 illustrates another example of the thermal exhaust monitoring system according to aspects of the disclosure.

To facilitate the cooling of hardware components, a server may divide its hardware components into a number of "zones." Each of the zones may be associated with a cooling device (e.g., a fan) of the exhaust temperature control system 118. FIG. 2 illustrates one example of the thermal exhaust monitoring system 102 where the hardware components, namely the memory 104, the hard drives 124-126, and the processor 106, have been divided into various component zones 202-206. Each of the various component zones 202-206 may be associated with a cooling device of the exhaust temperature control system 118. Similar to the component zones 202-206 of the thermal exhaust monitoring system 102, a server being monitored by the thermal exhaust monitoring system 102 may also divide its hardware components into component zones, where a local cooling device of an exhaust temperature control system cools each component zone.

By dividing the hardware components into component zones, the thermal exhaust monitoring system 102 need only send a "component-zone specific" command to the exhaust temperature control system to cool a specific component zone rather than a "global" command to cool the entire server. In this way, when the thermal monitoring application 108 detects that a particular hardware component is overheating (e.g., a component temperature margin has fallen below the minimum component temperature margin threshold), the thermal monitoring application need only send a command to the exhaust temperature control system to cool the specific component zone of the overheating hardware component (e.g., by setting the temperature delta of the component zone to the minimum temperature delta). Establishing component zones may reduce the amount of cooling capacity a server requires in order to maintain a given thermal exhaust temperature.

To keep track of which cooling devices are assigned to which component zones, the thermal exhaust monitoring system 104 may also maintain a zone mapping database 208. Although the present disclosure does not limit the arrangement of the zone mapping database 208, the zone mapping database 208 may be stored in computer registers, as a relational database defined by a table having a plurality of different fields and records, XML documents or flat files. The zone mapping database 208 may also be formatted in any computer-readable format.

The zone mapping database 208 may contain a number of entries that associate a given cooling device with a component zone and/or a hardware component. For example, assuming that the exhaust temperature control system 118 has three cooling devices, the zone mapping database 208 may have a first entry that associates a first cooling device with the component zone 202 (or the memory 104), a second entry that associates a second cooling device with the component zone 204 (or the processor 106), and a third entry that associates a third cooling device with the component zone 206 (or the hard drive 124 and the hard drive 126). In this example, should the processor 106 begin to overheat, the thermal monitoring application 108 may first refer to the zone mapping database 208 to determine which component zone the processor 106 is located in, and then the thermal monitoring application 108 may instruct the exhaust temperature control system 118 to cool the identified component zone. An association between cooling devices and component zones may be helpful where there are multiple hardware components and multiple cooling devices assigned to a specific zone (e.g., associations between cooling devices and component zones may reduce data overhead in the zone mapping database 208).

The zone mapping database 208 may also contain associations for servers being monitored by the thermal exhaust monitoring system 104. It is also possible that a given server has a local zone mapping database 208. Thus, when the thermal monitoring application 108 detects an overheating hardware component in a monitored server, the thermal monitoring application 108 may refer to the zone mapping database 208 (or may query the zone mapping database of the monitored server) to determine which component zone the overheating hardware component is located in. In this manner, the zone mapping database 208 provides an effective mechanism by which the thermal exhaust monitoring system 102 may selectively decide which cooling devices should be activated in order to cool a detected overheating hardware component.

Information about the components in the zone mapping database may be detected and updated when component changes are made to the server. For instance, the thermal exhaust monitoring system may be able to determine certain aspects of the components that are installed on a server and might affect its thermal exhaust, such as the amount or type of memory, the model or processing speed of a processor, etc. When a change in a component is detected, such as by replacing a component with an upgraded version of the same component, the thermal exhaust monitoring system may automatically update the zone mapping database by retrieving more information about the new component or estimating a change in the likely thermal exhaust based on the extent of the change. By way of further example, the thermal exhaust monitoring system may also determine when components are added to or removed from a server. Different components overheat at different temperatures, and by tracking the changes in the components the system may determine when additional or lesser cooling is likely to be necessary.

Figure 3:
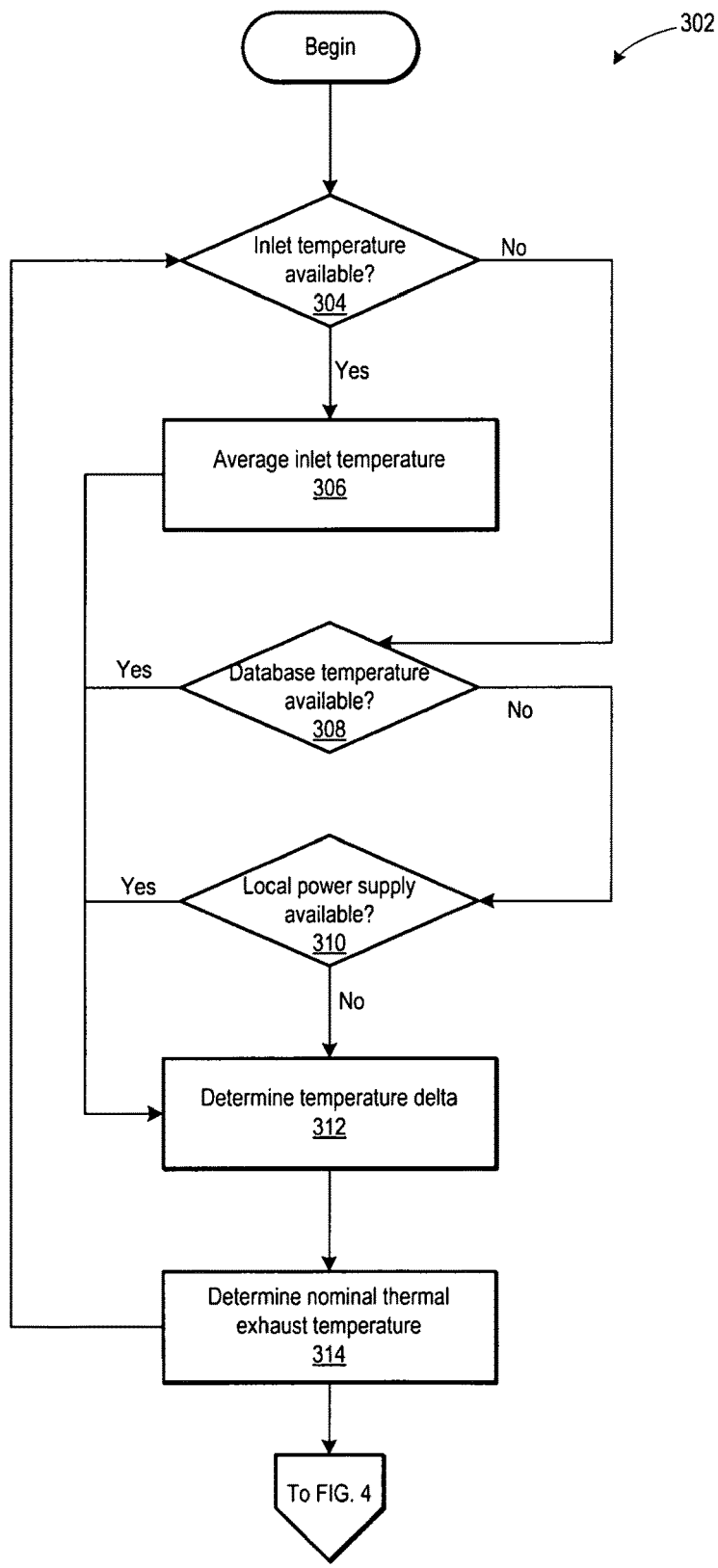
FIGS. 3-4 illustrate logic flow for monitoring and maintaining thermal exhaust temperatures according to aspects of the disclosure.
Figure 4:
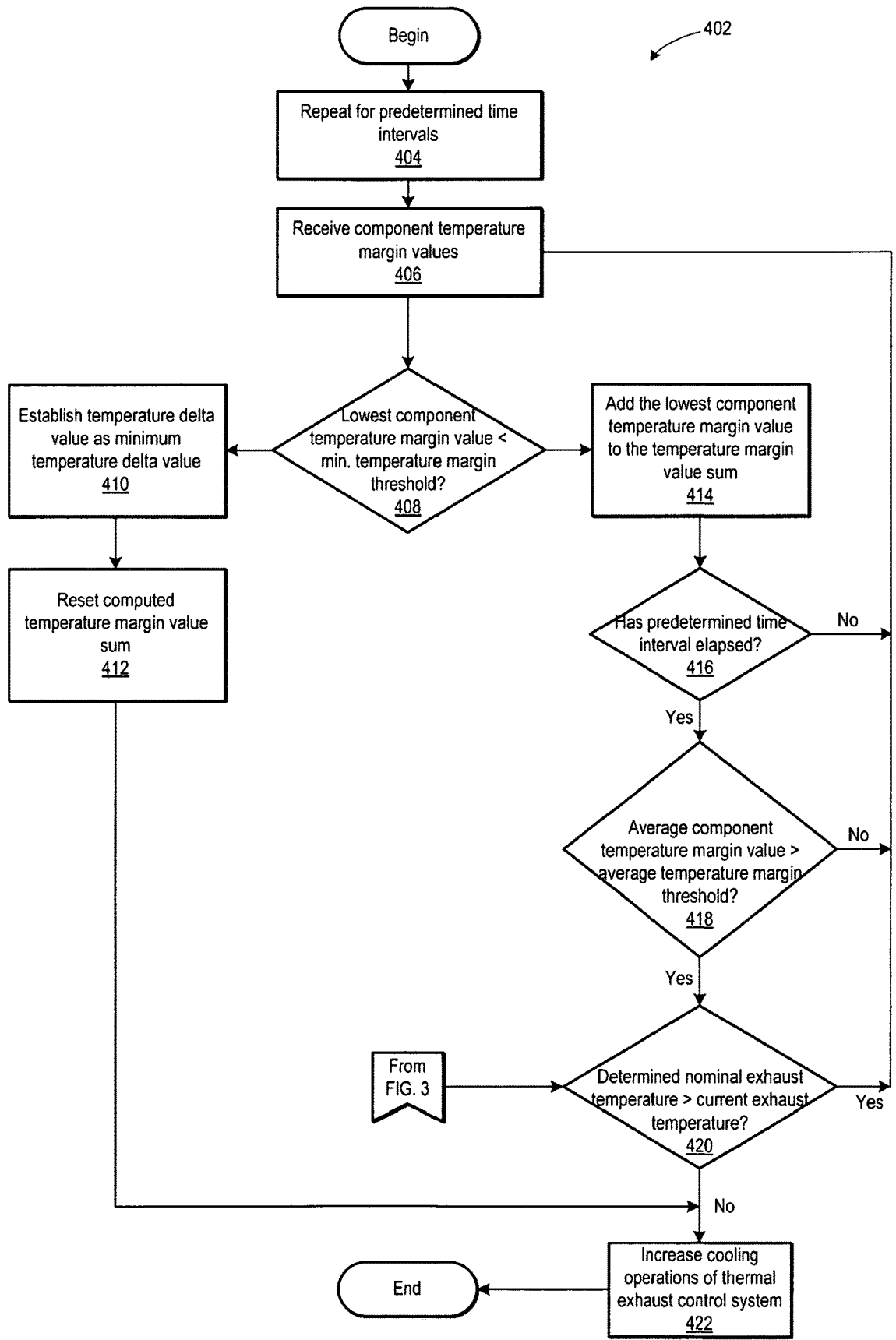

FIGS. 3-4 illustrate one example of logic flow for monitoring and maintaining the thermal exhaust for servers being monitored by the thermal exhaust monitoring system 102. FIG. 3 illustrates a first control loop 302 that establishes the nominal thermal exhaust temperature for a server being monitored (or even the thermal exhaust monitoring system 102 itself). FIG. 4 illustrates a second control loop 402 that determines whether a hardware component being monitored is overheating or whether the determined nominal exhaust temperature (from FIG. 3) exceeds the current thermal exhaust temperature of a given server.

Referring first to FIG. 3, the thermal monitoring application 108 may first determine whether an inlet temperature is available for a given server or even for the thermal monitoring system 102 (Block 304). As previously discussed, the inlet temperature may be available from a first inlet temperature source, such as the inlet temperature probe 120. Where an inlet temperature probe 120 is available, the thermal monitoring application 108 may average a received predetermined number of inlet temperature values over a predetermined period of time (Block 306). For example, the thermal monitoring application 108 may average ten inlet temperature values over a period of five minutes.

However, it is possible that an inlet temperature from an inlet temperature probe 120 is not available. For example, a given server may not have an inlet temperature probe 120. An inlet temperature probe 120 may also be unresponsive. In this case, the thermal monitoring application 108 may query the temperature database 114 for an expected inlet temperature value of the given server. (Block 308). As discussed previously, depending on the location and environment of a given server, the expected inlet temperature may vary from server to server. The inlet temperature retrieved from the temperature database 114 may then be used by the thermal monitoring application 108 to determine an expected, or nominal, thermal exhaust temperature for the given server.

As previously discussed, the temperature database 114 may not contain an expected inlet temperature for a given server. For example, the given server may not have been entered into the temperature database 114. Under these circumstances, the thermal monitoring application 108 may query the given server to determine whether the given server has a predetermined component (Block 310). For example, the thermal monitoring application 108 may query a given server to determine whether a given server has the predetermined or specific component, such as a battery or other component. The presence of the specific component may indicate the environment in which the server operates, such as a warm environment when a battery is determined to be present. Conversely, the lack of a specific component may indicate that the given server is operating in another type of environment, such as a cooler environment known to have a colder temperature when a battery is determined not to be present. The thermal monitoring application 108 may establish the inlet temperature for the given server based on whether the given server replies with whether it has the specific component.

The thermal monitoring application 108 may then determine a temperature delta from the determined inlet temperature (whether the inlet temperature was determined from an inlet temperature probe 120, determined from a query to the temperature database 114, or determined from a query to a given server regarding whether the given server has a specific component) (Block 312). In one implementation, the thermal monitoring application 108 may query the temperature database 114 with the inlet temperature to retrieve a corresponding temperature delta. Alternatively, the temperature database 114 may not include the determined inlet temperature, in which case the thermal monitoring application 108 may determine the expected temperature delta from one or more proximate inlet temperatures, such as through linear interpolation. Yet further, should the determined inlet temperature fall outside of the range of inlet temperatures covered by the temperature database 114, the thermal monitoring application 108 may establish the temperature delta as the temperature delta for the inlet temperature in the temperature database 114 closest to the determined inlet temperature.

Based on the determined temperature delta, the thermal monitoring application 108 may then determine the expected, or nominal, thermal exhaust temperature for the given server (Block 314). In one implementation, the thermal exhaust temperature may be determined through an operation executed on the determined temperature delta and the determined inlet temperature, such as adding the determined temperature delta and the determined inlet temperature. The expected thermal exhaust temperature may then be passed to the control loop 402 shown in FIG. 4. The control loop 302 may then return to determining whether an inlet temperature is available for the given server (Block 304). Returning to determining whether an inlet temperature is available may occur continuously (e.g., substantially simultaneously as the completion of the control loop 302) or may occur at predetermined time intervals, such as every five minutes.

Referring to FIG. 4, the control loop 402 controls the monitoring and reactions to hardware components that may be overheating. Initially, the thermal monitoring application 108 and/or the component monitoring application 110 are established with a predetermined time interval in which the control loop 402 is to be repeated (Block 404). For example, the thermal monitoring application 108 and/or the component monitoring application 110 may be instructed to repeat the control loop 402 at five minute intervals, ten minute intervals, or at some other interval of time.

The thermal monitoring application 108 may then receive/retrieve one or more hardware component temperature margin values from the component monitoring application 110 (Block 406). As previously discussed, one or more hardware components may be monitored by a component temperature probe 122 (which may be local to a given server), and the component temperature probe 122 may report component temperature values to the component monitoring application 110. The component monitoring application 110 may then convert the received component temperature value to a component temperature margin value, such as by comparing the received component temperature value with a previously established component temperature threshold value. Alternatively, the component monitoring application 110 may communicate the received component temperature value to the thermal monitoring application 108, and the thermal monitoring application 108 may perform the conversion of the received component temperature value to a component temperature margin value.

After receiving one or more component temperature margin values for one or more hardware components of a given server, the thermal monitoring application 108 may then select the lowest component temperature margin value and compare the lowest component temperature margin value with a minimum temperature margin threshold (Block 408). This comparison may determine whether the hardware component with the lowest component temperature margin value is overheating. For example, if a hard drive temperature margin value is reported as 3° C., and the minimum component temperature margin threshold value is 5° C., the thermal monitoring application 108 may determine that the hard drive is overheating.

If the thermal monitoring application 108 determines that a given hardware component is overheating (that is, the lowest component temperature margin value is less than the minimum component temperature margin threshold), the thermal monitoring application 108 may establish the temperature delta for the corresponding server as a minimum temperature delta (Block 410). In effect, selecting the minimum temperature delta for the given server instructs an exhaust temperature control system that the thermal exhaust for the given server should approximate the inlet temperature for the given server. The minimum temperature delta may be established on a server by server basis, such as in situations where one server may be in a warm environment and another server may be in a cold environment. The thermal monitoring application 108 may refer to the temperature database 114 to retrieve the minimum temperature delta for the given server.

As an alternative implementation, where the given server leverages component zones, as discussed with reference to FIG. 2, the thermal monitoring application 108 may establish the temperature delta for the component zone corresponding to the overheating hardware component as the minimum temperature delta. Moreover, each component zone of the given server may have a predetermined temperature delta, which may vary from component zone to component zone. The various minimum temperature deltas for the component zones may be stored in the temperature database 114.

The thermal monitoring application 108 may then reset a running temperature margin value sum (Block 412). As discussed with reference to Block 414 below, the running temperature margin value sum may be used to determine whether one or more overheating hardware components are cooling off as a result of increased cooling operations by an exhaust temperature control system.

Once the temperature delta for the given server (or component zone corresponding to the overheating hardware component) is established as the minimum temperature delta, the thermal monitoring application 108 may instruct a exhaust temperature control system, which may be local to the given server or corresponding component zone, to increase cooling operations based on the established temperature delta (Block 422). As previously discussed, the thermal monitoring application 108 may communicate an expected thermal exhaust temperature, based on the minimum temperature delta and previously received inlet temperature, to the exhaust temperature control system 118. The exhaust temperature control system 118 may then increase a fan speed to effectuate a change in a detected thermal exhaust temperature. Hence, the exhaust temperature control system 118 may become primarily responsible for decreasing the thermal exhaust temperature of the given server or component zone. Moreover, the exhaust temperature probe 116 of the given server (or component zone) may report the thermal exhaust temperature to the thermal exhaust monitoring system 102, which may provide the thermal exhaust temperature as a metric to client devices via the component monitoring application 110.

Returning to Block 408, in the event that the lowest component temperature margin value exceeds the selected minimum temperature margin threshold, the thermal monitoring application 108 may determine that the hardware components are not overheating. The thermal monitoring application 108 may then add the lowest component temperature margin value to the running temperature margin sum (Block 414).

The thermal monitoring application 108 may then determine whether the predetermined time interval, established in Block 404, has elapsed (Block 416). If the predetermined time interval has not elapsed, the control loop 402 for the thermal monitoring application 108 and/or component monitoring application 410 may return to Block 406.

However, if the predetermined time interval has elapsed, the thermal monitoring application 108 may determine whether an average component temperature margin value exceeds an average component temperature margin threshold (Block 418). The average component temperature margin value may be determined by dividing the running temperature margin value sum by the number of times the control loop was added to the running temperature margin value sum. For example, if the control loop 402 has executed operations in Blocks 408-418 nine times, the running temperature margin value sum may be divided by nine. The average temperature margin threshold may be established on a server by server basis, a hardware component by hardware component basis, or on some other basis. The average temperature margin threshold may also be stored in the temperature database 114.

If the average component temperature margin value does not exceed the average temperature margin threshold, meaning that one or more hardware components are operating within a desired thermal range and no changes to cooling should be made, the control loop 402 may return to Block 406. However, if the average component temperature margin value does exceed the average temperature margin threshold, meaning that one or more hardware components are operating slightly cooler, the thermal monitoring application may then determine whether the nominal exhaust temperature (from the control loop 302) exceeds the current exhaust temperature (Block 420).

Should the determined nominal exhaust temperature exceed the current exhaust temperature, the control loop 402 may return to Block 406. Moreover, because the determined nominal exhaust temperature exceeds the current exhaust temperature, this may mean that the given server is using too much cooling capacity. In one implementation, the thermal monitoring application 108 may raise an alert indicating that the given server is using too much cooling capacity. The thermal monitoring application 108 may raise this alert after a predetermined number of times of determining that the nominal exhaust temperature exceeds the current exhaust temperature.

Should the determined nominal exhaust temperature not exceed the current exhaust temperature, this may mean that there is extra cooling capacity for the given server. Accordingly, the thermal monitoring application 108 may request increases in the cooling operations of the exhaust temperature control system 118 (Block 422). In one implementation, should the thermal monitoring application 108 reach Block 422 via Block 420, the thermal monitoring application 108 may request increases to the thermal exhaust temperature of the given server by predetermined amounts. For example, the thermal monitoring application 108 may request a 1° C. increase in the exhaust temperature of the given server. Alternatively, the thermal monitoring application 108 may increase the temperature delta for the given server (such as by increasing the temperature delta by 1° C.), and may communicate the increased temperature delta to the exhaust temperature control system 118. Accordingly, the exhaust temperature control system may perform corresponding adjustments to one or more cooling devices based on the increased temperature delta.

In this manner, the thermal exhaust monitoring system 104 effectively manages the cooling capacity for a facility where one or more servers may be located. By leveraging temperature margins for various hardware components located in the one or more servers, the thermal exhaust monitoring system 104 decreases the amount of throttling experienced by servers and ensures that no one server is excessively using the cooling capacity of the facility. Hence, the thermal exhaust monitoring system 104 represents a more efficient and streamlined mechanism for keeping servers operating at their optimal operating temperatures.

Monitoring the servers for overheating may also include measuring other characteristics of the servers, such as power consumption or workload. For example, if the server is using high amounts of power, then this may indicate that the server is potentially overheating. Similarly, if the server is performing a relatively large amount of tasks (i.e., has a heavy workload), then this may also indicate that the server is potentially overheating. When the measured power consumption or workload of the server signifies that the server may be overheating, then the cooling devices of the server may be activated. As another example, if the measured power consumption or workload do not signify that the server is potentially overheating, then the cooling devices may be switched off or simply stay off. In another example, the opposite may be true in that the detection of a low workload may indicate that the server is potentially overheating. For instance, a server with a low workload may not activate its fans or other cooling devices. The server, however, still operates at a minimum degree of performance. Thus, without the necessary cooling devices switching on, the server could potentially overheat.

Based on the monitoring of characteristics such as power consumption or workload, the exhaust temperature control system 118 may perform one or more of its respective functions as discussed above. For example, the exhaust temperature control system may increase fan speed or other cooling mechanism. A server with a heavy workload may be more likely to have an overheated processor, in which case the cooling device of the component zone associated with the processor may be switched on sooner than it may have been if the workload of the processor was not being monitored.

As these and other variations and combinations of the features discussed above can be utilized without departing from the subject matter as defined by the claims, the foregoing description of the exemplary implementations should be taken by way of illustration rather than by way of limitation of the subject matter as defined by the claims. It will also be understood that the provision of the examples described herein (as well as clauses phrased as "such as," "e.g.", "including" and the like) should not be interpreted as limiting the claimed subject matter to the specific examples; rather, the examples are intended to illustrate only some of many possible aspects.

The invention claimed is:

1. A method for controlling an exhaust temperature by establishing temperature difference values, the method, implemented by a processor, comprising:
    monitoring, with the processor in communication with an exhaust temperature control system, an inlet temperature value associated with a plurality of components;
    determining a temperature difference value based on the inlet temperature value and a stored association between the inlet temperature value and a stored temperature difference value;
    determining an exhaust temperature value based on the inlet temperature value and the temperature difference value;
    transmitting the exhaust temperature value to the exhaust temperature control system;
    determining a temperature of each component of the plurality of components;
    determining a plurality of component temperature margin values by determining, for each component of the plurality of components, a component temperature margin value based on the difference between a temperature of the component and a threshold operating temperature associated with the component;
    establishing the temperature difference value based on the lowest component temperature margin value of the plurality of component temperature margin values; and
    transmitting the established temperature difference value to the exhaust temperature control system to control the exhaust temperature.

2. The method of claim 1, wherein the stored association and the stored temperature difference values are being stored in a memory prior to said monitoring.

3. The method of claim 1, wherein the inlet temperature value comprises an inlet temperature value derived from an inlet temperature source.

4. The method of claim 1, wherein the inlet temperature value is selected based on a geographic location.

5. The method of claim 1, wherein the inlet temperature value is determined by averaging a plurality of temperature measurements.

6. The method of claim 1, wherein determining the temperature difference value comprises querying a temperature difference database with the inlet temperature value.

7. The method of claim 1, further comprising increasing the temperature difference value by a predetermined amount based on a comparison of an average value of the determined component temperature margin values with a second component margin threshold value.

8. The method of claim 6, further comprising determining the temperature difference value through interpolation when the temperature difference database does not include the inlet temperature value.

9. The method of claim 3, wherein the inlet temperature source is a temperature probe that monitors an air inlet.

10. The method of claim 3, further comprising polling the inlet temperature source at predetermined time intervals to update the inlet temperature value.

11. The method of claim 1, further comprising:
   associating each component temperature margin value with at least one of a plurality of components; and
   associating each component with at least one of a plurality of zones.

12. The method of claim 11 further comprising updating a zone database when there is a change to a given zone, wherein the change is selected from a group of changes consisting of adding, removing, and replacing a component.

13. The method of claim 11, wherein each of the plurality of zones is associated with one or more cooling devices.

14. The method of claim 1, further comprising operating the one of the plurality of components at increasing temperatures until the one of the plurality of components exhibits a decrease in performance or an instability.

* * * * *